(12) United States Patent
Sasaki

(10) Patent No.: US 12,470,200 B2
(45) Date of Patent: Nov. 11, 2025

(54) ELECTRONIC COMPONENT HOUSING PACKAGE, ELECTRONIC DEVICE, AND ELECTRONIC MODULE

(71) Applicant: KYOCERA Corporation, Kyoto (JP)

(72) Inventor: Takahiro Sasaki, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 996 days.

(21) Appl. No.: 17/620,837

(22) PCT Filed: Jun. 24, 2020

(86) PCT No.: PCT/JP2020/024858
§ 371 (c)(1),
(2) Date: Dec. 20, 2021

(87) PCT Pub. No.: WO2020/262472
PCT Pub. Date: Dec. 30, 2020

(65) Prior Publication Data
US 2022/0385266 A1 Dec. 1, 2022

(30) Foreign Application Priority Data
Jun. 27, 2019 (JP) .................. 2019-120065

(51) Int. Cl.
*H03H 9/05* (2006.01)
*H03H 9/10* (2006.01)
*H03H 9/19* (2006.01)

(52) U.S. Cl.
CPC ........ *H03H 9/0523* (2013.01); *H03H 9/1021* (2013.01); *H03H 9/19* (2013.01)

(58) Field of Classification Search
CPC ........ H10N 30/875; H10N 30/87; H03H 9/19; H03H 9/0514; H03H 9/0523; H03H 9/1021; H01L 23/49805; H01L 23/13; H01L 23/56; H01L 23/055; H01L 21/4807
See application file for complete search history.

(56) References Cited

U.S. PATENT DOCUMENTS

| | | | | |
|---|---|---|---|---|
| 5,789,278 | A * | 8/1998 | Akram | .............. H01L 24/29 |
| | | | | 257/E21.511 |
| 2004/0227218 | A1* | 11/2004 | Farnworth | .......... H01L 23/4985 |
| | | | | 257/E23.065 |
| 2018/0358949 | A1 | 12/2018 | Kisaki et al. | |
| 2019/0043770 | A1 | 2/2019 | Kisaki et al. | |
| 2020/0335433 | A1* | 10/2020 | Kisaki | .......... H05K 1/0296 |

FOREIGN PATENT DOCUMENTS

| | | |
|---|---|---|
| JP | 2002-164451 A | 6/2002 |
| WO | 2015/141100 A1 | 9/2015 |
| WO | 2017/090508 A1 | 6/2017 |

* cited by examiner

*Primary Examiner* — J. San Martin
(74) *Attorney, Agent, or Firm* — Volpe Koenig

(57) ABSTRACT

An electronic component housing package includes: an insulating substrate including a main surface; an external connection conductor including a portion exposed at the main surface; and an inner layer conductor located inside of the external connection conductor in a thickness direction of the insulating substrate, in which the external connection conductor includes a protruding portion extending toward the inner layer conductor, and the protruding portion is in contact with the inner layer conductor.

11 Claims, 3 Drawing Sheets

ELECTRONIC COMPONENT HOUSING PACKAGE, ELECTRONIC DEVICE, AND ELECTRONIC MODULE

TECHNICAL FIELD

The present invention relates to an electronic component housing package configured to house an electronic component such as a piezoelectric oscillation element or a semiconductor element, an electronic device, and an electronic module.

Background Art

An electronic component housing package has been conceived. The electronic component housing package has a configuration in which an electronic component is housed in a mounting portion having a recessed shape, and the electronic component in the mounting portion is connected to a wiring conductor provided outside. After the electronic component is housed in the electronic component housing package, the mounting portion is hermetically sealed with a lid to obtain an electronic device. This makes it possible to achieve easy handling and easy wiring connection (see, for example, JP 2002-164451 A).

Summary of Invention

An electronic component housing package of the present disclosure includes: an insulating substrate including a main surface; an external connection conductor including a portion exposed at the main surface; and an inner layer conductor located inside of the external connection conductor in a thickness direction of the insulating substrate, in which the external connection conductor includes a protruding portion extending toward the inner layer conductor, and the protruding portion is in contact with the inner layer conductor.

An electronic device of the present disclosure includes the electronic component housing package described above and an electronic component mounted in the electronic component housing package.

An electronic module of the present disclosure includes a module substrate including a connection pad and the electronic device described above to which the connection pad is connected.

DESCRIPTION OF EMBODIMENTS

Figure 1:
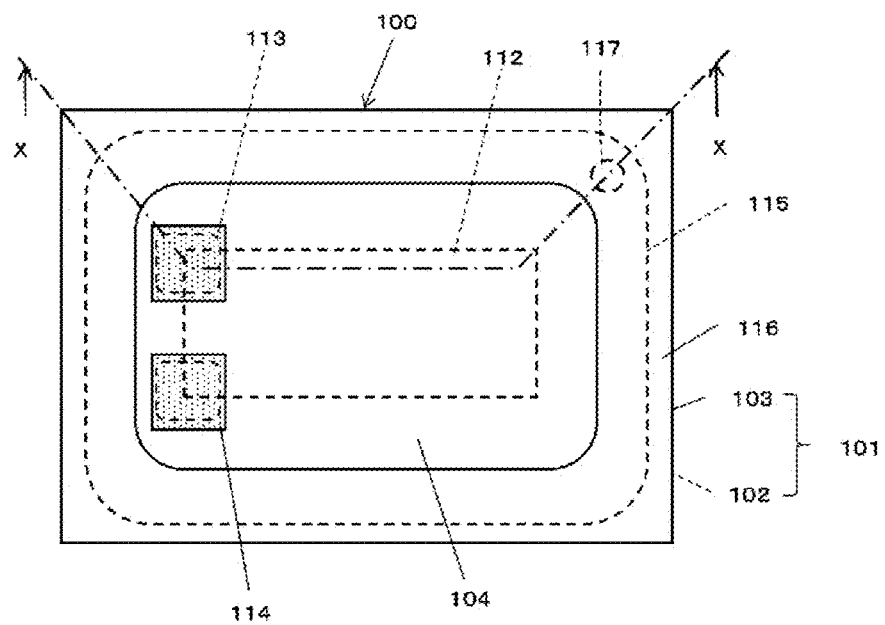
FIG. 1 is an upper-surface perspective view illustrating an electronic component housing package or the like of the present disclosure.

An embodiment of the present disclosure will be described in detail with reference to the drawings. An electronic component housing package 100 according to an embodiment of the present disclosure is a structural body, for example, in which a frame portion 103 including a first main surface 101a and a base portion 102 including a second main surface 101b (main surface) are integrated with each other. The frame portion 103 includes a frame-shaped metallization layer 116 and a via conductor 117. The base portion 102 includes an external connection conductor 105, a protruding portion 106, an inner layer conductor 107, an electrode pad 114, and the via conductor 117. The first main surface 101a constitutes a sealing surface at which a lid 115 is bonded. The second main surface 101b constitutes a mounting surface for a module substrate 301. The frame-shaped metallization layer 116 is located at the first main surface 101a. After an electronic component 112 is mounted on the mounting portion 104, the lid 115 is bonded on the frame-shaped metallization layer 116 using a brazing material to hermetically seal the electronic component 112. Note that the electronic component housing package 100 may be configured such that the frame portion 103 and the base portion 102 are separately configured using different insulating layers, and the frame portion 103 and the base portion 102 are bonded together to form a structural body.

The base portion 102 has a flat plate shape and includes the mounting portion 104 located in a center range in which the electronic component 112 is mounted on an opposite side of the second main surface 101b. FIG. 1 illustrates an example in which a crystal resonator (piezoelectric element) is mounted as the electronic component 112.

An insulating substrate 101 including the base portion 102 and the frame portion 103 is made out of an insulating material. Examples of the insulating material include, for example, a ceramic material such as an aluminum oxide-based sintered body, an aluminum nitride sintered body, a mullite-based sintered body, or a glass-ceramic sintered body.

Figure 3:
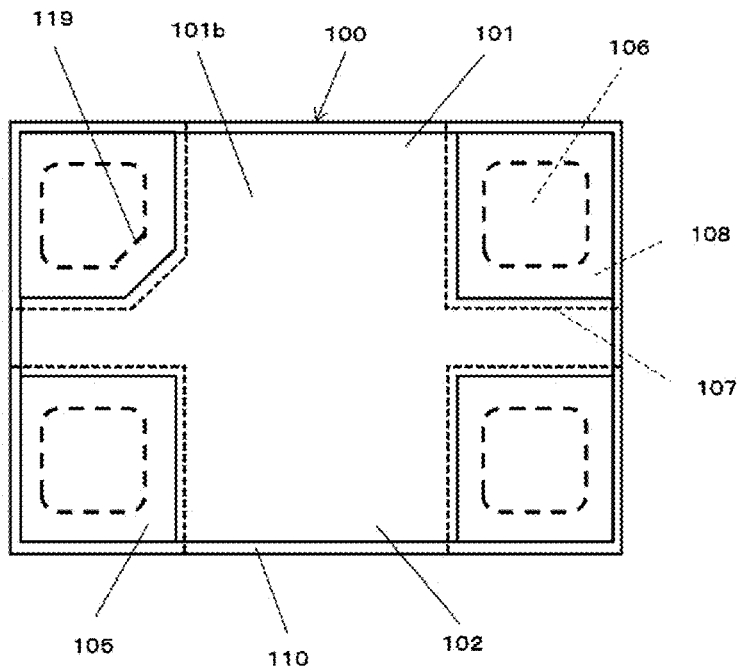
FIG. 3 is a lower-surface perspective view illustrating the electronic component housing package or the like of the present disclosure.

The external connection conductor 105 extends at the second main surface 101b side, and is located on the second main surface 101b having a shape of plane exposed to the outside. For example, four external connection conductors 105 are located on the base portion 102 as illustrated in FIG. 3. The external connection conductors 105 each have a quadrangle shape as a shape in plan view as illustrated in FIG. 3, and are each located at each of four corners of the base portion 102 at the second main surface 101b side.

Figure 2:
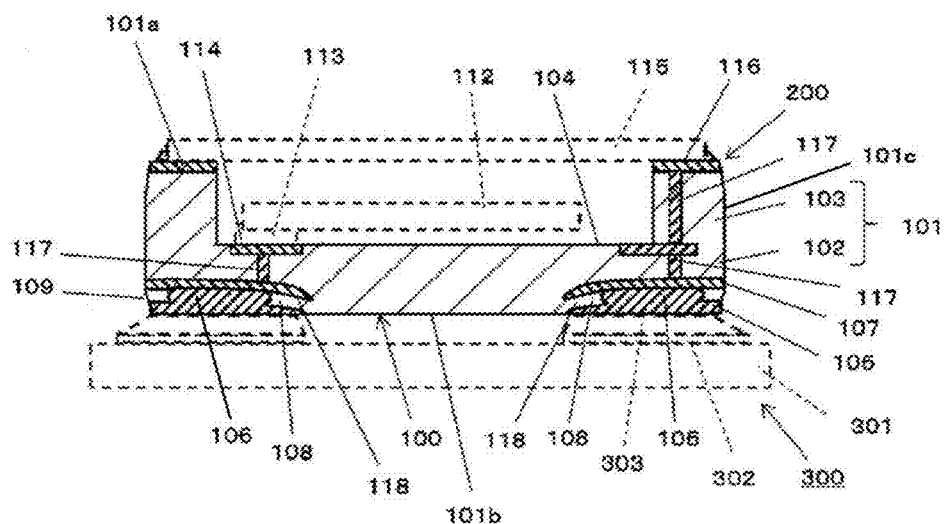
FIG. 2 is a cross-sectional view taken along the line X-X of the electronic component housing package or the like illustrated in FIG. 1.
Figure 4:
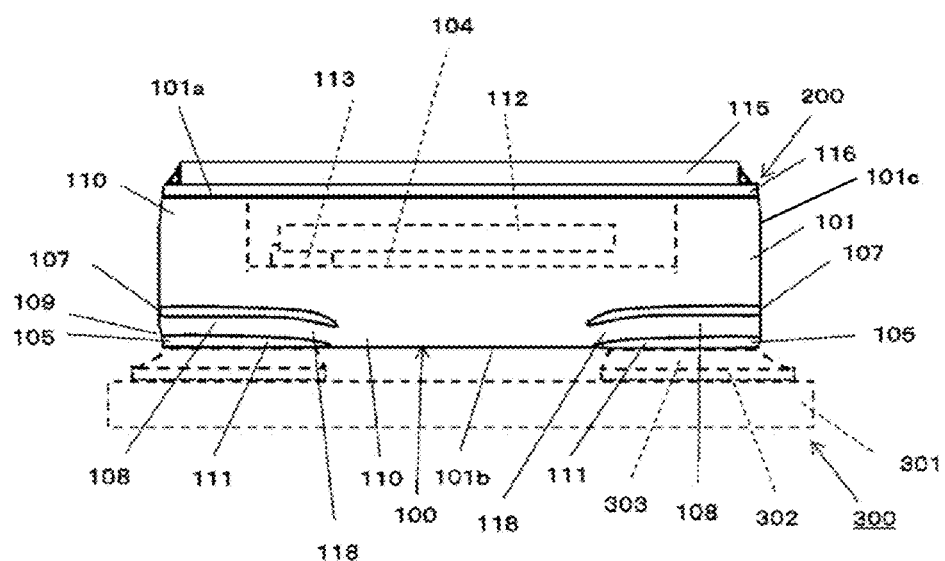
FIG. 4 is a side view illustrating the electronic component housing package or the like of the present disclosure.

The inner layer conductor 107 is located at the inside of the base portion 102 so as to be opposed to the external connection conductor 105 in a planar manner. In addition, as illustrated in FIG. 2, the inner layer conductor 107 is located so as to be sloped from the outer edge of the base portion 102 toward a direction of the center of the base portion 102 in a cross-sectional perspective view. In addition, as illustrated in FIGS. 3 and 4, the end portion of the inner layer conductor 107 is exposed at the side surface of the base portion 102. In addition, the external connection conductor 105 and the inner layer conductor 107 are connected at a portion of the external connection conductor 105 that corresponds to the second main surface 101b side of the insulating substrate 101 and also connected with a protruding portion 106 having a surface area in a plan view smaller than the inner layer conductor 107 and located at the inner side. Also, as described in detail below, the protruding portion 106 can be shaped to correspond to the shape of the external connection conductor in a plan view and have an area that is smaller than the external connection conductor but at least 50% of the surface area of the external connection conductor 105.

Furthermore, a surrounding portion 108 is located in a region extending between the external connection conductor 105 and the inner layer conductor 107 and excluding the protruding portion 106 of the external connection conductor 105. As illustrated in FIG. 2, an electrode pad 114 located at the mounting portion 104 is connected through the via conductor 117, the inner layer conductor 107, and the protruding portion 106 to one external connection conductor 105. In addition, the frame-shaped metallization layer 116 and located at the first main surface 101a of the frame portion 103 is connected through the via conductor 117, the inner layer conductor 107, and the protruding portion 106 to the other external connection conductor 105. Note that a relay conductor (not illustrated) may be located at some midpoint of the via conductor 117, and may be connected to the external connection conductor 105 using a configuration in which the via conductor 117 is connected through the relay conductor.

For example, two external connection conductors 105 respectively connected from two electrode pads 114 are disposed as two external connection conductors 105 each located on a diagonal line of four corners of the base portion 102 among four external connection conductors 105 located at the second main surface 101b, and external connection conductors 105 connected from the frame-shaped metallization layer 116 are connected as other two external connection conductors 105 located at a diagonal line of four corners of the base portion 102.

The electronic component housing package 100 of the present disclosure includes the insulating substrate 101 including a main surface, the external connection conductor 105 including a portion exposed at the main surface, and the inner layer conductor 107 located inside of the external connection conductor 105 in a thickness direction of the insulating substrate 101, in which the external connection conductor 105 includes the protruding portion 106 extending toward the inner layer conductor 107, and the protruding portion 106 is in contact with the inner layer conductor 107.

With this configuration, the protruding portion 106 of the external connection conductor 105 extends into the insulating substrate 101, which makes it possible to increase the bonding strength of the external connection conductor 105 to the insulating substrate 101. In other words, the external connection conductor 105 and the inner layer conductor 107 are disposed so as to be opposed to each other in a plan view. In addition, the external connection conductor 105 and the inner layer conductor 107 are connected to each other with the protruding portion 106 of the external connection conductor 105. Thus, since a portion of the insulating substrate 101 is interposed between the external connection conductor 105 and the inner layer conductor 107, the bonding strength between the insulating substrate 101 and the external connection conductor 105 can be increased.

As illustrated in FIG. 2, the inner layer conductor 107 is located at the inside of the base portion 102 so as to be opposed to the external connection conductor 105. In addition, the inner layer conductor 107 is located so as to be sloped from the outer edge of the base portion 102 toward a direction of the center of the base portion 102 in a cross-sectional perspective view. Note that, in a cross-sectional perspective view, an end portion of the inner layer conductor 107 closest to the second main surface 101b side is located closer to the first main surface 101a side than the end portion of the external connection conductor 105 closest to the first main surface 101a side. Furthermore, the external connection conductor 105 located at the second main surface 101b of the electronic component housing package 100 is connected to the module substrate 301 having a connection pad 302 through a connection member 303 such as solder.

Figure 5:
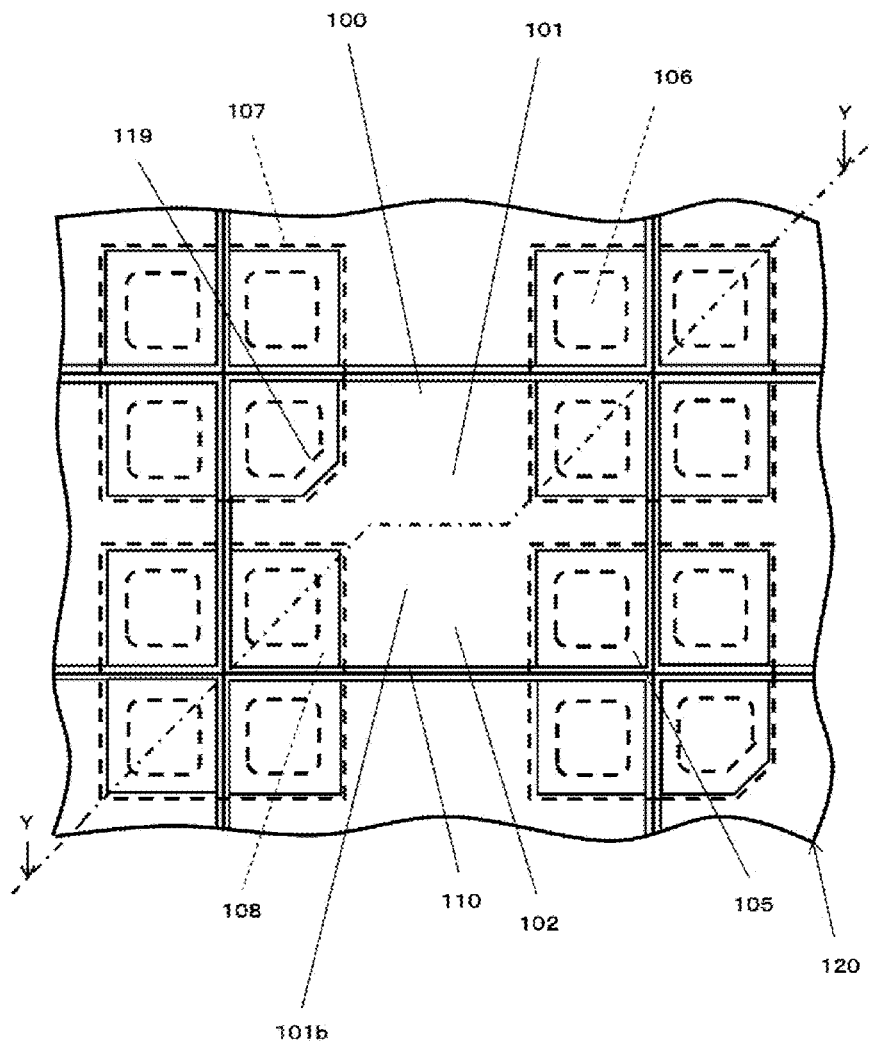
FIG. 5 is a lower-surface perspective view illustrating a mother substrate at which electronic component housing packages of the present disclosure are arrayed.
Figure 6:
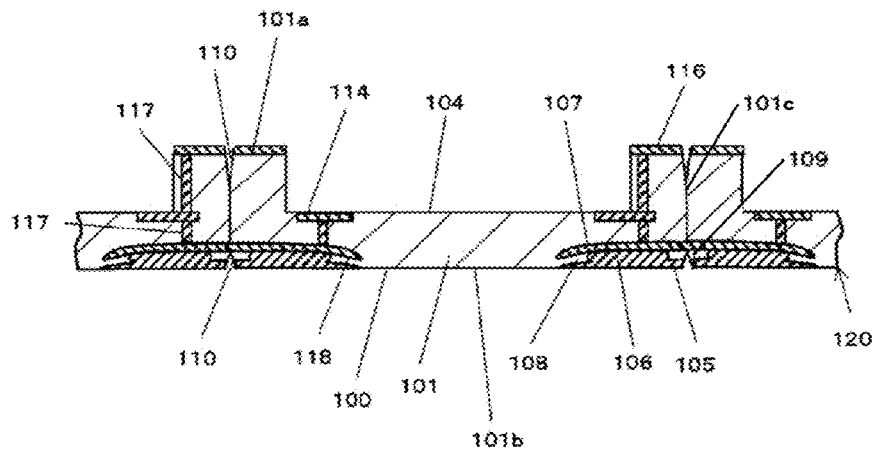
FIG. 6 is a cross-sectional view taken along the line Y-Y of the mother substrate illustrated in FIG. 5.

In addition, the inner layer conductor 107 is located so as to be sloped from the outer edge of the base portion 102 toward the center portion side of the base portion 102 in a cross-sectional perspective view, and is disposed furthest away from the second main surface 101b at four corners of the insulating substrate 101. At the mother substrate 120 at which wiring substrate regions (electronic component housing packages 100) are arrayed, the inner layer conductor 107 functions as an electrically conductive path for connection conductors of adjacent wiring substrate regions together, as illustrated in FIGS. 5 and 6. Thus, an inner layer conductor 107 of one wiring substrate region and an inner layer conductor 107 of the other wiring substrate region are connected across a boundary of the wiring substrate regions. With this configuration, each conductor of the one wiring substrate region and each conductor of the other wiring substrate region are integrated, which enables electrical connection of the entire individual conductors of wiring substrate regions arrayed at the mother substrate 120. Each of the conductors includes the external connection conductor 105, the protruding portion 106, the inner layer conductor 107, the electrode pad 114, the frame-shaped metallization layer 116, and the via conductor 117.

Furthermore, in the electronic component housing package 100 of the present disclosure, the protruding portion 106 is located at the inside of the insulating substrate 101. With this configuration, the protruding portion 106 of the external connection conductor 105 enters the inside of the insulating substrate 101, which makes it possible to further increase the bonding strength between the insulating substrate 101 and the external connection conductor 105. In other words, in a plan view, the external connection conductor 105 and the inner layer conductor 107 are disposed so as to be opposed to each other, and the external connection conductor 105 and the inner layer conductor 107 are connected with the protruding portion 106 of the external connection conductor 105, as illustrated in FIG. 3. Note in FIG. 3 that the protruding portion 106, indicated by section lines, has a shape that is smaller and corresponds to the shape of the external connection conductor 105 that it protrudes from. This results in a portion of the insulating substrate 101 being located between the external connection conductor 105 and the inner layer conductor 107 so as to surround the protruding portion 106. This causes the stress in a planar direction acting from the module substrate 301 on the external connection conductor 105 to be dispersed at the protruding portion 106, and can achieve high bonding strength of the external connection conductor 105 to the insulating substrate 101. Note that, for example, four external connection conductors 105 are located in a rectangular manner at four corners of the insulating substrate 101 in a plan view, as illustrated in FIG. 3. In addition, the protruding portion 106 has a surface area smaller than that of the inner layer conductor 107 or the external connection conductor 105, and is located in a rectangular manner.

In addition, as illustrated in FIGS. 3 and 4, the external connection conductor 105 is exposed at the second main surface 101b side of the base portion 102 and the side surface 101c of the part of the insulating substrate 101 that is the base portion 102. Furthermore, an outer peripheral end portion of the inner layer conductor 107 is also exposed at the side surface 101c of the base portion 102. The connection member 303 configured to connect the external connection conductor 105 of the electronic component housing package 100 and the connection pad 302 of the module substrate 301 is connected to an entire surface of the external connection conductor 105 that is exposed at the second main surface 101b and also to a portion of the base portion 102 that is exposed at a side surface 101c of the base portion 102, which enables the electronic component housing package 100 to be firmly connected to the module substrate 301. Note that, at this time, on the outer peripheral side surface 101c of the insulating substrate 101, an insulating material (a portion of the insulating substrate 101) is located between the external connection conductor 105 and the inner layer conductor 107. Thus, the inner layer conductor 107 is not in contact with the connection member 303. As a result, a large part of the connection member 303 is suppressed from moving toward the connection conductor side including the external connection conductor 105 of the electronic component housing package 100, which makes it possible to suppress a short or the like with an adjacent electronic device due to an excessive fillet of the connection member 303 or the like.

Furthermore, in the electronic component housing package 100 of the present disclosure, the insulating substrate 101 includes the surrounding portion 108 disposed between the inner layer conductor 107 and the external connection conductor 105 and being in contact with the protruding portion 106 in a plan view. With this configuration, the electronic component housing package 100 can be provided in which deformation of the insulating substrate 101 is suppressed while enhancing the bonding strength of the external connection conductor 105 to the insulating substrate 101. In other words, the connection conductor located at the second main surface 101b side of the insulating substrate 101 is configured to include the external connection conductor 105, the protruding portion 106, and the inner layer conductor 107. This makes it possible to locate a portion of the external connection conductor 105 that corresponds to the second main surface 101b side of the insulating substrate 101 and the inner layer conductor 107 while suppressing the thicknesses of these portions. With this configuration, the effect of firing shrinkage at the mother substrate 120 is reduced at the time of manufacturing the electronic component housing package 100, which makes it possible to provide the electronic component housing package 100 in which deformation of the insulating substrate 101 is suppressed.

In addition, the external connection conductor 105 and the inner layer conductor 107 are connected with the protruding portion 106 which is centered on the external connection conductor 105 and, when viewed in plan, has a shape that corresponds to and is smaller, but not less than 50%, than the shape of the external connection conductor 105 such that the surrounding portion 108 is present around the entire protruding portion 106. With this configuration, the external connection conductor 105 and the inner layer conductor 107 are firmly bonded to the surrounding portion 108. This makes it possible to enhance the bonding strength of the external connection conductor 105 to the insulating substrate 101.

Note that description has been made of an example in which four external connection conductors 105 are located in a rectangular manner at four corners of the insulating substrate 101 in a plan view, and the protruding portion 106 has a surface area smaller than that of the inner layer conductor 107 or the external connection conductor 105, and is provided in a rectangular manner. However, the embodiment is not limited to that described above. For example, it may be possible to employ a configuration in which one corner portion of one external connection conductor 105 of the four external connection conductors 105 has a chamfer, and the external connection conductor 105 having the chamfer is used as an alignment mark for the electronic component housing package 100. In addition, the external connection conductor 105 having the chamfer may include a side portion 119 facing the center side of the insulating substrate 101. In addition, the external connection conductor 105 and the protruding portion 106 may be located so as to have a circular shape, a polygonal shape, a quarter-circular shape or the like, in addition to a rectangular shape, or a combination of a plurality of shapes. At this time, it may be possible to employ a configuration in which the protruding portion 106 configured to connect the external connection conductor 105 and the inner layer conductor 107 has a surface area in a plan view smaller than, but not less than 50% of the total area of the external connection conductor 105, that of the external connection conductor 105 or the inner layer conductor 107, and the protruding portion 106 is provided at a position between a portion of the external connection conductor 105 that corresponds to the second main surface 101b side of the insulating substrate 101 and the inner layer conductor 107. In this manner, the surrounding portion 108 that surrounds the protruding portion 106 is located between the external connection conductor 105 and the inner layer conductor 107, and the external connection conductor 105 and the inner layer conductor 107 are firmly bonded with the surrounding portion 108 throughout the entire periphery of the external connection conductor 105. This makes it possible to achieve high bonding strength of the external connection conductor 105 to the insulating substrate 101.

Furthermore, in the electronic component housing package 100 of the present disclosure, the surrounding portion 108 includes a concave and convex portion 109 with a portion exposed at a side surface 101c of the insulating substrate 101. With the configuration described above, a contact between the inner layer conductor 107 and the connection member 303 can be effectively suppressed. In other words, the concave and convex portion 109 prevents the large part of the connection member 303 from moving toward the portion of the inner layer conductor 107 exposed at the side surface 101c of the insulating substrate 101 in the electronic component housing package 100. This can suppress a short or the like with an adjacent electronic devices due to an excessive fillet of the connection member 303 or the like.

Specifically, the connection member 303 configured to connect the external connection conductor 105 of the electronic component housing package 100 and the connection pad 302 of the module substrate 301 is connected to the entire surface of the external connection conductor 105 that is exposed at the second main surface 101b and also to a portion of the base portion 102 that is exposed at the side surface 101c of the insulating substrate 101. This series of connections makes the electronic component housing package 100 firmly connected to the module substrate 301. Thus, the connection member 303 creeps up the side surface 101c of the insulating substrate 101 due to surface tension at the time of melting. However, with the concave and convex portion 109 of the surrounding portion 108 that is exposed at the side surface 101c of the insulating substrate 101, it is difficult for the connection member 303 to creep up the side surface 101c of the insulating substrate 101. This suppresses a short or the like with an adjacent electronic device due to an excessive fillet of the connection member 303 or the like. For example, the concave and convex portion 109 can be configured with a broken surface obtained at the time of dividing the mother substrate 120 illustrated in FIGS. 5 and 6 along the cross-sectional plane 110 located between wiring substrate regions.

Note that, as illustrated in FIG. 4, the external connection conductor 105 is located such that the thickness of the external connection conductor 105 increases from the center side of the insulating substrate 101 toward the outer edge in a side view. This configuration is effective because the bonding strength between the insulating substrate 101 and the external connection conductor 105 increases at the outer edge of the insulating substrate 101 that is most likely to receive stress at the time of connection of the external connection conductor 105 and the module substrate 301.

In addition, in a side view, the concave and convex portion 109 is located at an exposed portion of the surrounding portion 108 at the side surface 101c of the insulating substrate 101. The inner layer conductor 107 is less likely to be exposed at the time of manufacturing the electronic component housing package 100 from the mother substrate 120, and the external connection conductor 105 and the inner layer conductor 107 are less likely to be connected between adjacent wiring substrate regions during a plating process. This makes it possible to suppress a reduction in the separation property of the mother substrate 120.

In other words, the external connection conductor 105 is located at the second main surface 101b, and external connection conductors 105 between adjacent wiring substrate regions at the mother substrate 120 have already been spaced apart from each other at the cross-sectional plane 110 before separation. Thus, during the plating process, external connection conductors 105 adjacent to each other are less likely to be connected between wiring conductors. Furthermore, the concave and convex portion 109 is located at the surrounding portion 108. This makes it difficult to dispose the cross-sectional plane 110 at the sloped inner layer conductor 107. In addition, most of the inner layer conductor 107 is configured to be located at the inside of the base portion 102. Thus, the metal layer 111 is less likely to be provided at the inner layer conductor 107, and inner layer conductors 107 adjacent to each other are less likely to be connected to each other at the metal layer 111 during the plating process.

Furthermore, in the electronic component housing package 100 of the present disclosure, a portion of the surrounding portion 108 that corresponds to an inner side of the insulating substrate 101 has a thickness smaller than the thickness of a portion corresponding to the outer side of the insulating substrate 101. The configuration described above can provide the electronic component housing package 100 in which deformation at the mounting portion 104 of the insulating substrate 101 is suppressed while enhancing the bonding strength of the external connection conductor 105 to the insulating substrate 101. In other words, the connection conductor located at the second main surface 101b side of the insulating substrate 101 includes the external connection conductor 105, the protruding portion 106, and the inner layer conductor 107, and the external connection conductor 105 and the inner layer conductor 107 are disposed so as to be opposed to each other in a plan view. In addition, the thickness of the surrounding portion 108 at the inner side of the insulating substrate 101 is smaller than that at the outer side of the insulating substrate 101. Thus, in a side perspective, the distance between the mounting portion 104 and the inner layer conductor 107 in the thickness direction increases toward the direction of the center of the insulating substrate 101. This suppresses the effect of firing shrinkage at the mounting portion 104 due to the thickness of the inner layer conductor 107. This makes it possible to provide the electronic component housing package 100 in which deformation at the mounting portion 104 of the insulating substrate 101 is suppressed.

As illustrated in FIG. 1, for example, the insulating substrate 101 has a flat plate shape, and the mounting portion 104 at which the electronic component 112 is mounted is located at an opposite side from the second main surface 101b. In addition, in a case where the electronic component 112 to be mounted is a crystal resonator (piezoelectric element), a pair of electrode pads 114 are located at corners of the mounting portion 104. If the mounting portion 104 of the insulating substrate 101 is deformed, the pair of electrode pads 114 described above are not horizontal. Thus, even if an electrode (not illustrated) of the electronic component 112 to be mounted is disposed so as to be opposed to the pair of electrode pads 114, the electrode pads 114 at the insulating substrate 101 side and the electrode of the electronic component 112 are not parallel to each other. This leads to a possibility of reduction in the performance of the electronic component 112 such as tilting of the electronic component 112 or non-uniformity of the thickness of the bonding member 113. However, the electronic component housing package 100 with excellent mounting reliability of the electronic component 112 can be provided in which deformation at the mounting portion 104 of the insulating substrate 101 can be suppressed.

In addition, in the electronic component housing package 100 of the present disclosure, a portion of the surrounding portion 108 that is located at the center side of the insulating substrate 101 includes a bent portion 118 that is bent toward the main surface side, in a cross-sectional view along the thickness direction of the insulating substrate 101. With the configuration described above, the inner layer conductor 107 is suppressed from being hollowed out, which makes it possible to achieve an excellent package in terms of dimensional accuracy. That is, since the surrounding portion 108 includes the bent portion 118, the thickness gradually reduces from the outer edge of the insulating substrate 101 toward the inner side. Thus, in the thickness direction, the distance from the second main surface 101b to the inner layer conductor 107 at the inner side of the insulating substrate 101 is smaller than the distance from the second main surface 101b to the inner layer conductor 107 at the outer side of the insulating substrate 101. With this configuration, at the time of dividing the mother substrate 120 illustrated in FIGS. 5 and 6 into individual pieces of wiring substrates (electronic component housing packages 100), the inner layer conductor 107 is not divided at one time, and is divided in a manner such that it is torn off from the second main surface 101b side toward the first main surface 101a side. This suppresses the hollowing of the inner layer conductor 107.

As described above, to position the inner layer conductor 107 or the like at the insulating substrate 101, it is only necessary, for example, that a metallized paste to be the inner layer conductor 107 is applied through a screen printing method or the like onto a second main surface 101b side of each wiring substrate region of a ceramic green sheet to be the base portion 102. A ceramic paste to be the surrounding portion 108 is applied onto the second main surface 101b side of each wiring substrate region except for the center portion of the applied metallized paste to be the inner layer conductor 107. In addition, a metallized paste to be the external connection conductor 105 is re-applied through a screen printing method or the like onto the ceramic paste described above. Furthermore, the second main surface 101b side of the processed ceramic green sheet is pressurized. In this manner, the surrounding portion 108 is deformed so as to have a thickness gradually reducing toward the inner side of the insulating substrate 101, and is configured such that the bent portion 118 is located. In the configuration described above, as illustrated in FIG. 2, the inner layer conductor 107 is configured so as to be sloped. At four corners of the insulating substrate 101, the inner layer conductor 107 is disposed furthest from the second main surface 101b. Furthermore, the inner layer conductor 107 is configured to be closest to the second main surface 101b at the center portion side of the insulating substrate 101, in other words, at an end portion of the inner layer conductor 107. In addition, the exposed surface of the external connection conductor 105 is configured to be located at the same plane as the second main surface 101b. As other methods, a press-fitting method or a plating method may be used to locate the inner layer conductor 107, the protruding portion 106, and the external connection conductor 105 at the insulating substrate 101.

In addition, with the configuration described above, even if a mechanical stress is applied to the external connection conductor 105 through the connection member 303 due to deflection or the like of the module substrate 301 in the connection between the electronic component housing package 100 and the module substrate 301, the stress described above can be spread to the protruding portion 106, the surrounding portion 108, and the inner layer conductor 107, which makes a crack less likely to occur.

In other words, the external connection conductor 105 and the inner layer conductor 107 are disposed so as to be opposed to each other in a cross-sectional perspective view. In addition, the external connection conductor 105 and the inner layer conductor 107 are connected with the protruding portion 106 at the center portion side of the external connection conductor 105. Thus, even if a stress is applied from the connection member 303 onto the external connection conductor 105, the stress can be spread at the outer peripheral portion of the external connection conductor 105 to the surrounding portion 108, and also can be spread at the center portion side of the external connection conductor 105 to the protruding portion 106 and the inner layer conductor 107. In addition, the distance from the inner layer conductor 107 to the inner surface of the mounting portion 104 is large at the center portion side of the insulating substrate 101. With this configuration, a crack starting from the external connection conductor 105 side toward the inner surface side of the mounting portion 104 is less likely to occur. This achieves the electronic component housing package 100 exhibiting excellent reliability in terms of hermetic sealing.

Furthermore, in the electronic component housing package 100 of the present disclosure, the protruding portion 106 includes a side portion 119 facing the center side of the insulating substrate 101 in a plan view. With the configuration described above, the bonding strength of the external connection conductor 105 to the insulating substrate 101 can be increased. In addition, for example, in a case where one corner portion of one external connection conductor 105 among four external connection conductors 105 includes a chamfer and the protruding portion 106 includes the side portion 119, the protruding portion 106 maintains a shape that corresponds to the shape of the external connection conductor 105. According to this configuration, the external connection conductor 105 having the chamfer described above is used as an alignment mark for the electronic component housing package 100, the bonding strength of the external connection conductor 105 to the insulating substrate 101 can be increased even at the external connection conductor 105 having the chamfer.

In other words, the external connection conductor 105 and the inner layer conductor 107 are disposed so as to be opposed to each other in a plan view where the protruding portion 106 between them has a shape that corresponds to the shape of the external connection conductor 105. In addition, the external connection conductor 105 having the chamfer and the inner layer conductor 107 are connected to an external connection conductor 105 with a protruding portion 106 having the side portion 119. Thus, the insulating substrate 101 can be held between the external connection conductor 105 and the inner layer conductor 107. Furthermore, with the inner layer conductor 107 located at the inner side of the base portion 102 and the protruding portion 106 having the side portion 119, wiring conductors can be firmly connected with the external connection conductor 105 having the chamfer.

Note that, with the configuration in which the protruding portion 106 includes the side portion 119 facing the center side of the insulating substrate 101 in a plan view illustrated in FIGS. 3 and 5, even if the external connection conductor 105 having the chamfer is located at the second main surface 101b of the insulating substrate 101, the outer edge of the protruding portion 106 located between the inner layer conductor 107 and a portion of the external connection conductor 105 that corresponds to the second main surface 101b side of the insulating substrate 101 does not extend beyond the outer edge of the external connection conductor 105. The outer edge of the protruding portion 106 does not extend beyond the outer edge of the external connection conductor 105 because the shape of the protruding portion 106 corresponds to and is smaller than the shape of the external connection conductor 105; however, in some embodiments, the area of the protruding portion 106 is not less than 50% of the area of the external connection conductor 105. This results in a structure in which the surrounding portion 108 is located over the entire periphery between the inner layer conductor 107 and the external connection conductor 105. In this manner, throughout the entire external connection conductor 105, firm connection can be made between wiring conductors of the inner layer conductor 107 and the external connection conductor 105 having the chamfer with the protruding portion 106 having the side portion 119.

In addition, even if the size of the electronic component housing package 100 reduces, the external connection conductor 105 having a chamfer that can be used as an alignment mark is located at the second main surface 101b of the electronic component housing package 100 while the bonding strength of the external connection conductor 105 to the insulating substrate 101 is increased. This suppresses a failure occurring at the time of mounting the electronic component 112 at the mounting portion 104 of the insulating substrate 101, which can provide the electronic component housing package exhibiting excellent mounting reliability for the electronic component 112.

Furthermore, in the electronic component housing package 100 of the present disclosure, at a side surface 101c of the insulating substrate 101, the metal layer 111 is located at an exposed portion of the external connection conductor 105, and the metal layer 111 does not extend to an exposed portion of the inner layer conductor 107 up the side surface 101c of the insulating substrate from the exposed portion of the external connection conductor 105 with the metal layer 111. With the configuration described above, the connection to the connection pad 302 of the module substrate 301 can be made in a favorable manner. In addition, and since the metal layer 111 is not located at the exposed surface of the inner layer conductor 107, the connection member 303 such as solder can be prevented from creeping up the inner layer conductor 107 side, which makes it possible to reduce the possibility of insufficient volume of the connection member 303 or a short with an adjacent electronic component 112 or the like.

Note that, in the example of the embodiment described above, the metal layer 111 refers to a nickel plating layer, a gold plating layer, or the like provided at the front surface of each of other exposed wiring conductors including the external connection conductor 105, and is adhered to the front surface of each of exposed wiring conductors sequentially. In addition, for example, the nickel plating layer is formed in approximately from 1.0 μm to 20 μm, and the gold plating layer is formed in approximately from 0.1 μm to 1.0 μm. The front surface of each of the exposed wiring conductors is covered with the metal layer 111 described above. This brings a wiring conductor exhibiting excellent corrosion resistance and favorable wettability in terms of solder, brazing material, and the like.

Furthermore, in a case where the metal layer 111 is not located at the exposed surface of the inner layer conductor 107, the inner layer conductor 107 is not exposed in the plating process at the mother substrate 120 at which wiring substrate regions to be electronic component housing packages 100 are arrayed as illustrated in FIGS. 5 and 6, and a plating liquid is not brought into contact with the inner layer conductor 107. Thus, the metal layer 111 is not adhered to the exposed surface of the inner layer conductor 107. In addition, the inner layer conductor 107 works as an electrically conductive path used to connect conductors of adjacent wiring substrate regions, and is exposed at a side surface of the electronic component housing package 100 as a broken surface when the mother substrate 120 is divided.

In this manner, the metal layer 111 is not located at the exposed surface of the inner layer conductor 107, and the surrounding portion 108 where the connection member 303 such as solder is not wet is configured to be located between the external connection conductor 105 and the inner layer conductor 107. This prevents the connection member 303 from creeping up, at the side surface 101c of the insulating substrate 101, from the external connection conductor 105 toward the inner layer conductor 107 side beyond the surrounding portion 108. This reduces the possibility of insufficient volume of the connection member 303 or a short with an adjacent electronic component or the like.

Note that, in the mother substrate 120, the inner layer conductor 107 works as an electrically conductive path used to connect conductors between adjacent wiring substrate regions. In a case where the inner layer conductor 107 is sloped as illustrated in FIG. 4, the inner layer conductor 107 is configured to be disposed furthest from the second main surface 101b at four corners of the insulating substrate 101. In addition, in a case where a metal mold or a cutter blade is pressed on a ceramic green sheet layered body to be the mother substrate 120 in order to locate the cross-sectional plane 110 at the mother substrate 120, the cross-sectional plane 110 is located at the external connection conductor 105 and the surrounding portion 108, and the cross-sectional plane 110 is also located at the end side of the inner layer conductor 107. This makes the inner layer conductor 107 less likely to be cut at four corners side of the insulating substrate 101. Thus, the electrically conductive path is secured at four corners side of the insulating substrate 101, and through the plating process, the metal layer 111 can be favorably positioned at a conductor exposed at each wiring substrate region of the mother substrate 120.

Note that an example in which the metal mold or the cutter blade is pressed on the mother substrate 120 has been given as a method of positioning the cross-sectional plane 110 on the mother substrate 120. However, other methods for positioning are possible. For example, the cross-sectional plane 110 may be positioned using a laser at a boundary of individual wiring substrate regions of the mother substrate 120. This case involves non-contact processing, and no deformation of a ceramic green sheet layered body occurs due to pressing of a metal mold or the like.

In the example of the present disclosure, the metal layers 111 such as a nickel layer or a gold layer are sequentially provided at front surfaces of exposed conductors such as the external connection conductor 105, the electrode pad 114, and the frame-shaped metallization layer 116. The front surfaces of individual exposed conductors are covered with the metal layers 111. This makes it possible to achieve an electronic component housing package exhibiting excellent corrosion resistance and having favorable wettability in terms of solder, brazing material, and the like.

An electronic device 200 of the present disclosure includes any of the electronic component housing packages 100 described above, and the electronic component 112 mounted in the electronic component housing package 100. With the configuration described above, the electronic device 200 exhibiting excellent connection reliability to the module substrate 301 can be provided by using the electronic component housing package 100 having the increased bonding strength of the external connection conductor 105 to the insulating substrate 101.

In other words, in the electronic component housing package 100, the external connection conductor 105 and the inner layer conductor 107 are disposed so as to be opposed to each other in a plan view, and the external connection conductor 105 and the inner layer conductor 107 are connected with the protruding portion 106, which has a shape corresponding to and smaller than the shape of the external connection conductor 105 in a plan view. Thus, the external connection conductor 105 and the inner layer conductor 107 are firmly bonded to the insulating substrate 101 including the surrounding portion 108. In addition, in the electronic component housing package 100, wiring conductors of the inner layer conductor 107 located at an inner side of the base portion 102 and the external connection conductor 105 are firmly connected to each other with the protruding portion 106. By using the electronic component housing package 100 exhibiting the excellent bonding strength of the external connection conductor 105 to the insulating substrate 101, the electronic device 200 exhibiting excellent connection reliability to the module substrate 301 can be provided.

As illustrated in FIG. 4, the external connection conductor 105 and the inner layer conductor 107 are exposed at a side surface on the long side and at a side surface on the short side of the electronic device 200, and the surrounding portion 108 is located between the external connection conductor 105 and the inner layer conductor 107. In addition, the metal layer 111 such as a nickel layer or a gold layer is located at the exposed entire surface of the external connection conductor 105. In addition, in a case where the metal layer 111 is not located at an exposed surface of the inner layer conductor 107, the inner layer conductor 107 is less likely to get wet when the electronic device 200 is mounted at the module substrate 301. Thus, the connection member 303 such as solder is prevented from creeping up the inner layer conductor 107 side exposed at the side surface of the insulating substrate 101. This makes it possible to reduce the possibility of insufficient volume of the connection member 303 or an unintended short with an adjacent electronic device or the like.

An electronic module 300 of the present disclosure includes the module substrate 301 including the connection pad 302, and the electronic device 200 described above to which the connection pad 302 is connected. With the configuration described above, the electronic module 300 having excellent reliability in terms of electronic properties can be provided, by using the electronic device 200 exhibiting the excellent connection reliability to the module substrate 301. In other words, in the electronic device 200, the external connection conductor 105 and the inner layer conductor 107 are disposed so as to be opposed to each other in a plan view. Furthermore, the external connection conductor 105 and the inner layer conductor 107 are connected with the protruding portion 106, which has a shape corresponding to and smaller than the shape of the external connection conductor 105 in a plan view. In addition, the electronic device 200 includes the electronic component housing package 100 in which the external connection conductor 105 and the inner layer conductor 107 are firmly bonded to the insulating substrate 101 including the surrounding portion 108.

Furthermore, the electronic component housing package 100 is configured such that wiring conductors of the inner layer conductor 107 located at the inner side of the base portion 102 and the external connection conductor 105 are firmly connected with the protruding portion 106. Thus, by using the electronic device 200 exhibiting excellent bonding strength of the external connection conductor 105 to the insulating substrate 101 and having excellent connection reliability, the electronic module 300 having high reliability in terms of electric properties can be provided.

In addition, by using the electronic device 200 described above, the external connection conductor 105 does not extend from the second main surface 101*b* of the insulating substrate 101 over the side surface 101*c* of the insulating substrate 101. This positioning of the external connection conductor 105 can suppress occurrence of a mounting failure of the electronic device 200 due to a Manhattan phenomenon in which the electronic device 200 rises up as a result that the side surface of the electronic device 200 which has been reduced in size and weight is pulled by the surface tension of the solder (connection member 303), when the electronic device 200 is positioned on the connection pad 202 of the module substrate 301 and soldered using a reflow method. Thus, even by using the electronic component housing package 100 having a reduced size, the electronic device 200 in which the electronic component 112 is mounted at the electrode pad 114 of the mounting portion 104 can be achieved. Thus, this suppresses a reduction in the bonding strength between the electronic device 200 and the module substrate 301, and provides the electronic module 300 having excellent connection reliability.

These are descriptions of the embodiment of the electronic component housing package 100 or the like of the present invention. However, the present invention is not limited to the embodiment described above. For example, although the embodiment described above gives an example in which four external connection conductors 105 are located at four corners, at the second main surface 101*b* side, of the base portion 102 of the insulating substrate 101, the number of the external connection conductors may be other than four, depending on types, shapes, or the like of the electronic device. In addition, as an example, the external connection conductor 105 has been described to be located at a location that is in contact with both the short sides and the long sides of the insulating substrate 101. However, the external connection conductor 105 may be disposed at a location that is in contact with only the short side of the insulating substrate 101 or only the long side. In the case described above, the surrounding portion 108 is configured to be located between the external connection conductor 105 and the inner layer conductor 107.

In addition, the embodiment described above gives the electronic component housing package 100 including the base portion 102 and the frame portion 103 as configurations including the wiring substrate of the present invention. However, the electronic component housing package of the present invention may have a configuration having a flat plate shape without any frame portion. Furthermore, the embodiment described above gives an example in which a crystal resonator is mounted as the electronic component. However, various modification examples may be used as the electronic component, including a semiconductor element, a capacitor, an inductor, a resistor, or the like. Moreover, details given in the embodiment can be changed on an as-necessary basis without departing from the main point of the invention.

REFERENCE SIGNS LIST

100 Electronic component housing package (wiring substrate)
101 Insulating substrate
101*a* First main surface
101*b* Second main surface
102 Base portion
103 Frame portion
104 Mounting portion
105 External connection conductor
106 Protruding portion
107 Inner layer conductor
108 Surrounding portion
109 Concave and convex portion
110 Cross-sectional plane
111 Metal layer
112 Electronic component
113 Bonding member
114 Electrode pad
115 Lid
116 Frame-shaped metallization layer
117 Via conductor
118 Bent portion
119 Side portion
120 Mother substrate
200 Electronic device
300 Electronic module
301 Module substrate
302 Connection pad
303 Connection member

The invention claimed is:
1. An electronic component housing package comprising:
an insulating substrate comprising a main surface;
an external connection conductor partially embedded in an inside of the insulating substrate, having a rectangular outline in a plan view, and comprising an exposed side and an opposing side, the exposed side being at least partially exposed to an outside of the insulating substrate at the main surface, the opposing side being embedded within the inside of the insulating substrate and facing away from the exposed side in a thickness direction of the insulating substrate; and an inner layer conductor disposed within the inside of the insulating substrate on a side of the external connection conductor in the thickness direction of the insulating substrate, wherein the external connection conductor comprises a protruding portion extending toward the inner layer conductor, the protruding portion is in contact with the inner layer conductor, and the protruding portion, in a plan view, is smaller than the external connection conductor and has a rectangular outline.

2. The electronic component housing package according to claim 1, wherein the protruding portion is embedded within the inside of the insulating substrate.

3. The electronic component housing package according to claim 1, wherein the insulating substrate comprises a surrounding portion that, in a cross-section view along the thickness direction of the insulating substrate, is interposed between the inner layer conductor and the external connection conductor, and the surrounding portion is in contact with the protruding portion.

4. The electronic component housing package according to claim 3, wherein the surrounding portion comprises a concave and convex portion, the concave and convex portion being disposed adjacent to and partially formed by an exposed portion of the surrounding portion at a side surface of the insulating substrate.

5. The electronic component housing package according to claim 3, wherein a first portion of the surrounding portion that corresponds to an inner side of the inside of the insulating substrate has a thickness smaller than a thickness of a second portion of the surrounding portion corresponding to an outer side of the inside of the insulating substrate.

6. The electronic component housing package according to claim 3, wherein a portion of the surrounding portion that corresponds to an inner side of the inside of the insulating substrate comprises a bent portion that bends toward the main surface in a cross-sectional view along the thickness direction of the insulating substrate.

7. The electronic component housing package according claim 1, wherein the protruding portion comprises a side portion which faces toward a center of the inside of the insulating substrate in the plan view.

8. The electronic component housing package according to claim 1, wherein further comprising a metal layer disposed on a laterally exposed portion of the external connection conductor wherein the metal layer does not extend to an exposed portion of the inner layer conductor exposed at the side surface of the insulating substrate.

9. An electronic device comprising:

the electronic component housing package according to claim 1; and an electronic component mounted in the electronic component housing package.

10. An electronic module comprising:

a module substrate comprising a connection pad; and the electronic device according to claim 9 to which the connection pad is connected.

11. The electronic component housing package according to claim 1, wherein the protruding portion has an area which is not less than 50% of that of the external connection conductor in the plan view.

* * * * *